United States Patent
Lim et al.

(10) Patent No.: US 11,152,410 B2
(45) Date of Patent: Oct. 19, 2021

(54) IMAGE SENSOR WITH REDUCED CAPACITANCE TRANSFER GATE

(71) Applicant: GLOBALFOUNDRIES Singapore Pte. Ltd., Singapore (SG)

(72) Inventors: Khee Yong Lim, Singapore (SG); Chia Ching Yeo, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 126 days.

(21) Appl. No.: 16/721,837

(22) Filed: Dec. 19, 2019

(65) Prior Publication Data

US 2021/0193713 A1 Jun. 24, 2021

(51) Int. Cl.
  *H01L 27/146* (2006.01)
  *H04N 5/374* (2011.01)
  *H01L 29/423* (2006.01)

(52) U.S. Cl.
  CPC .... *H01L 27/14614* (2013.01); *H01L 27/1461* (2013.01); *H01L 27/14689* (2013.01); *H01L 29/42368* (2013.01); *H04N 5/374* (2013.01)

(58) Field of Classification Search
  None
  See application file for complete search history.

(56) References Cited

U.S. PATENT DOCUMENTS

| | | | |
|---|---|---|---|
| 5,818,096 A | 10/1998 | Ishibashi et al. | |
| 8,557,624 B2* | 10/2013 | Anderson | H01L 27/14614 438/57 |
| 9,966,399 B2* | 5/2018 | Stark | H01L 27/14647 |
| 2012/0085888 A1* | 4/2012 | Endo | H01L 27/14609 250/208.1 |
| 2015/0200228 A1* | 7/2015 | Yao | H01L 27/1463 257/222 |
| 2017/0018584 A1* | 1/2017 | Ma | H01L 27/14627 |
| 2019/0252428 A1 | 8/2019 | Ma et al. | |

FOREIGN PATENT DOCUMENTS

EP 2919270 A1 9/2015

OTHER PUBLICATIONS

Jiaju Ma et al., A Pump-Gate Jot Device With High Conversion Gain for a Quanta Image Sensor, Electron Devices Society, Mar. 2015, 73-77, vol. 3, No. 2, IEEE, New Jersey, US.
Jiaju Ma et al., Jot Devices and the Quanta Image Sensor, 2014, IEEE, New Jersey, US.
Sergey Velichko et al., Low Noise High Efficiency 3.75 μm and 2.8 μm Global Shutter CMOS Pixel Arrays.
J, Michelot et al., Back Illuminated Vertically Pinned Photodiode with in Depth Charge Storage, International Mage Sensor Workshop 2011, 1-4, Hokkaido, Japan.

* cited by examiner

*Primary Examiner* — Ali Naraghi
(74) *Attorney, Agent, or Firm* — David Cain (57) ABSTRACT

An image sensor pixel comprises a semiconductor substrate and a gate having a dielectric layer with a first section and a second section over the semiconductor substrate. The first section of the dielectric layer is thinner than the second section. A photodiode is disposed substantially beneath the gate. A gate well region is disposed beneath the gate and overlying the photodiode. A first doped semiconductor region separates the gate well region from a second doped semiconductor region. The second doped semiconductor region is in the semiconductor substrate and is adjacent to the gate.

12 Claims, 6 Drawing Sheets

IMAGE SENSOR WITH REDUCED CAPACITANCE TRANSFER GATE

FIELD OF THE INVENTION

The disclosed embodiments relate generally to image sensors, and more particularly, to an image sensor with a transfer gate having a reduced capacitance and the manufacture thereof.

BACKGROUND

In a conventional complementary metal oxide semiconductor (CMOS) image sensor, incident photons are detected by a pinned photodiode (PPD). The photons incident on a PPD generates a signal charge which is subsequently transferred to a doped semiconductor region by pulsing a gate. However, the conventional CMOS image sensor has a low efficiency due to charge loss during the charge transfer of the signal charge. In addition, the readout speed is slow due to a high gate to doped semiconductor region capacitance.

Thus, there is an urgent need for an improved CMOS image sensor device structure to overcome the challenges mentioned above.

SUMMARY

In an aspect of the present disclosure, an image sensor pixel comprises a semiconductor substrate and a gate having a dielectric layer with a first section and a second section over the semiconductor substrate. The first section of the dielectric layer is thinner than the second section. A photodiode is disposed substantially beneath the gate. A gate well region is disposed beneath the gate and overlying the photodiode. A first doped semiconductor region separates the gate well region from a second doped semiconductor region. The second doped semiconductor region is in the semiconductor substrate, wherein the second doped semiconductor region is adjacent to the gate.

In another aspect of the present disclosure, an image sensor pixel comprises a semiconductor substrate and a gate having a dielectric layer with a first section and a second section over the semiconductor substrate. The first section of the dielectric layer is thinner than the second section. A photodiode is disposed substantially beneath the gate. A gate well region is disposed beneath the gate and overlying the photodiode. A first doped semiconductor region separates the gate well region from a second doped semiconductor region. The second doped semiconductor region is in the semiconductor substrate, wherein the second doped semiconductor region is adjacent to the gate. The gate well region is disposed beneath the first section of the dielectric layer. The first doped semiconductor region is disposed beneath the second section of the dielectric layer.

In yet another aspect of the present disclosure, a method of fabricating an image sensor is provided. The method comprises providing a substrate and forming a photodiode in the substrate. A first doped semiconductor region is formed adjacent to the photodiode. A gate well region is formed over the photodiode and adjacent to the first doped semiconductor region. A gate having a dielectric layer with a first section and a second section is formed over the gate well region and the first doped semiconductor region. The first section of the dielectric layer is thinner than the second section. A second doped semiconductor region is formed adjacent to the gate.

Numerous advantages may be derived from the embodiments described below. The embodiments herein result in a lower gate to doped semiconductor region capacitance and a faster readout speed. In addition, charge loss during the charge transfer of the signal charge is prevented thereby improving signal detection efficiency.

BRIEF DESCRIPTION OF THE DRAWINGS

The disclosed embodiments will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

Figure 1:
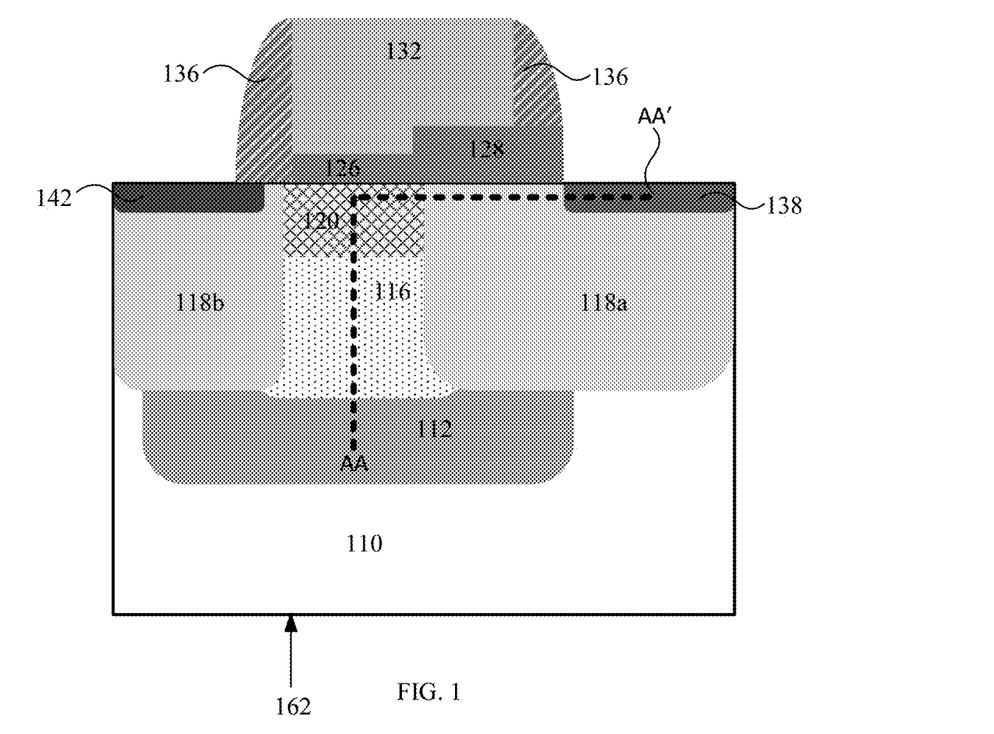
FIG. 1 is a cross-section view of a CMOS image sensor pixel, according to an embodiment of the disclosure.

FIG. 1 is a cross-section view of a CMOS image sensor pixel 100, according to an embodiment of the disclosure. The CMOS image sensor pixel 100 depicted in FIG. 1 includes a semiconductor substrate 110 and a gate having a gate electrode layer 132 and a dielectric layer with a first section and a second section, 126 and 128, respectively, over the semiconductor substrate 110. The first section of the dielectric layer 126 may be thinner than the second section of the dielectric layer 128. A photodiode comprising a storage well region 116 and a deep well region 112 may be disposed substantially beneath the gate. The deep well region 112 may be disposed beneath the storage well region 116. A gate well region 120 may be disposed beneath the gate and overlying the photodiode. A first doped semiconductor region 118a separates the gate well region 120 from a second doped semiconductor region 138. The second doped semiconductor region 138 may be in the semiconductor substrate 110 and may be adjacent to the gate. In an embodiment, the second doped semiconductor region 138 is adjacent to the second section of the dielectric layer 128.

The storage well 116, deep well 112 and second doped semiconductor 138 regions may be n-doped semiconductors. In an embodiment, the storage well region 116 has a higher dopant concentration than the deep well region 112. In an embodiment, the storage well region 116 may have a lower dopant concentration than the second doped semiconductor region 138.

The substrate 110, gate well region 120 and the first doped semiconductor region 118a may be in the form of p-doped semiconductors. In an embodiment, the gate well region 120 has a higher dopant concentration than the first doped semiconductor region 118a. The gate well region 120 may be disposed beneath the first section of the dielectric layer 126. The first doped semiconductor region 118a may be disposed beneath the second section of the dielectric layer 128.

Referring to FIG. 1, light incident on a backside 162 of the CMOS image sensor 100 generates electron-hole pairs at a p-n junction comprising the p-type semiconductor substrate 110 and the n-type deep well region 112. The generated electrons may drift to the storage well region 116 due to a built-in electric field at the p-n junction. The electrons may travel along path AA-AA' to the second doped semiconductor region 138. The gate well region 120 may be in inversion mode on application of a pulsing voltage on the gate, enabling the generated electrons to travel to the gate well region 120. Removal of the pulsing voltage from the gate causes the gate well region 120 to revert to an accumulation or depletion mode, enabling the generated electrons to travel to the second doped semiconductor region 138.

Figure 2:
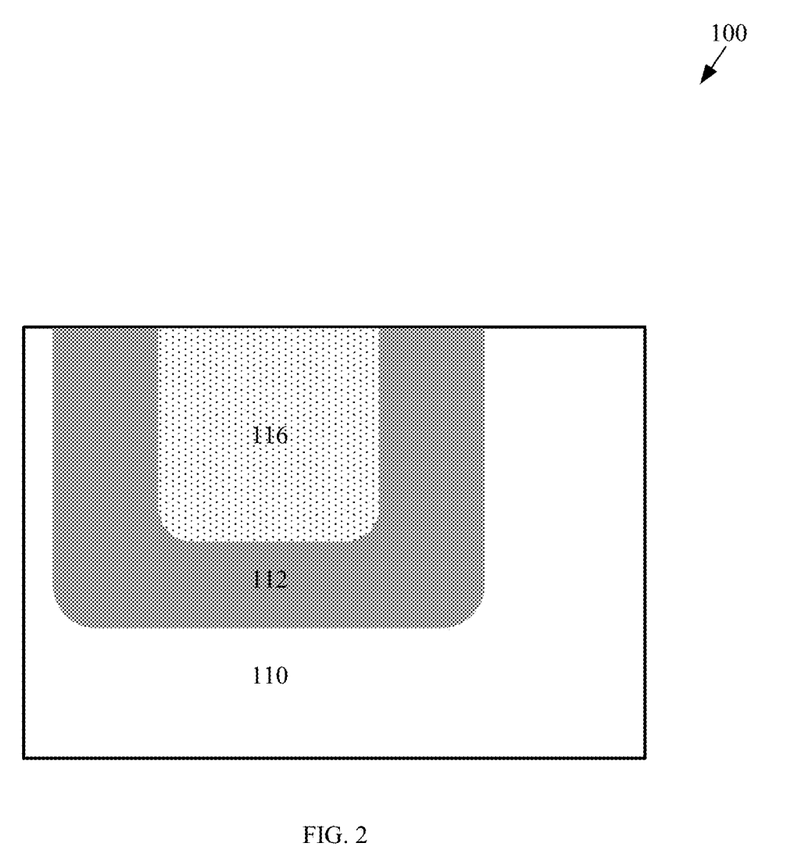
FIG. 2 is a cross-section view of a partially completed CMOS image sensor pixel, according to an embodiment of the disclosure.

FIG. 2 is a cross-section view of a partially completed CMOS image sensor pixel 100, according to an embodiment of the disclosure. Referring to FIG. 2, a semiconductor substrate 110 is provided. A photodiode may be formed in the substrate 110. The formation of the photodiode includes forming a deep well region 112 in the substrate 110 followed by forming a storage well region 116 over the deep well region 112. In an embodiment, the substrate 110 may be made of monocrystalline silicon. The formation of the deep well 112 and the storage well 116 regions may include doping with phosphorus or arsenic to form n-doped semiconductors followed by activation annealing.

Figure 3:
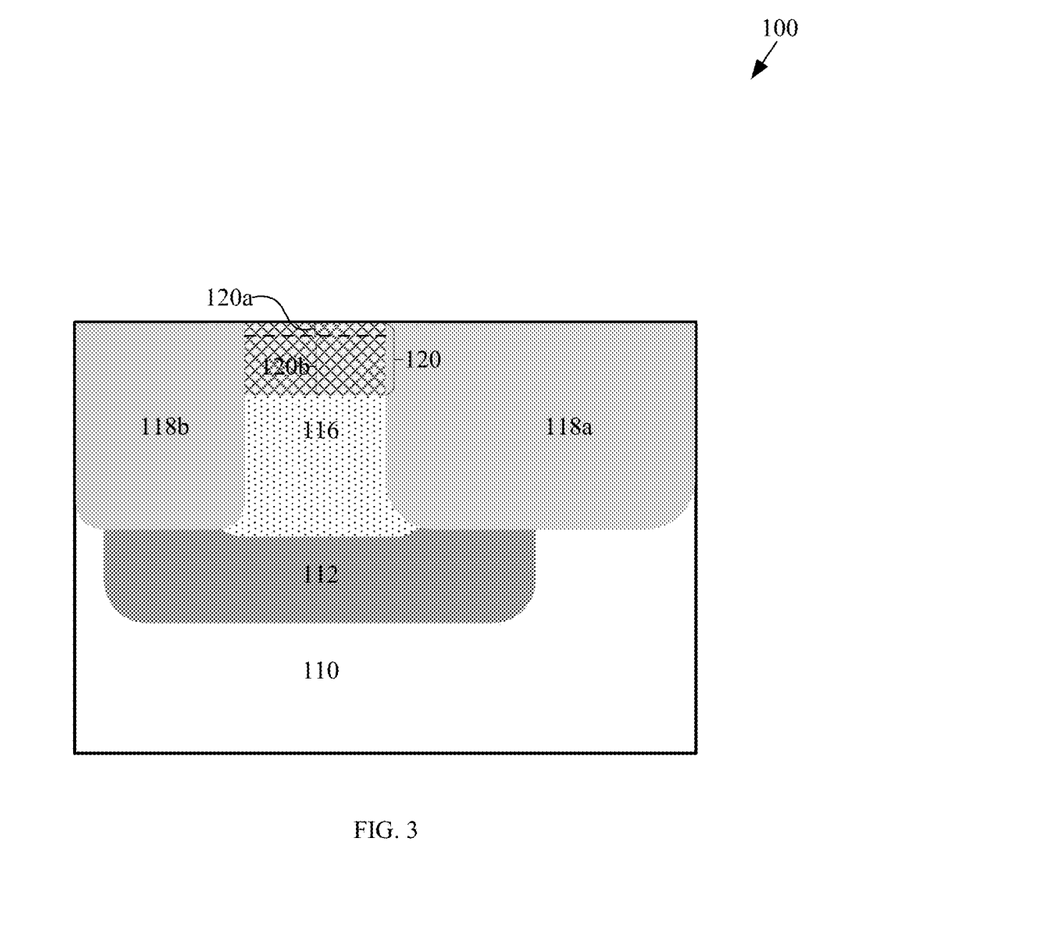
FIG. 3 is a cross-section view of a partially completed CMOS image sensor pixel after formation of a first and a third doped semiconductor regions and a gate well region, according to an embodiment of the disclosure.

FIG. 3 is a cross-section view of a partially completed CMOS image sensor pixel 100 after formation of first and third doped semiconductor regions, 118a and 118b, respectively, and a gate well region 120, according to an embodiment of the disclosure. Referring to FIG. 3, the first and third doped semiconductor regions, 118a and 118b, respectively, may be formed in the substrate 110, adjacent to opposite sides of the storage well region 116. In an embodiment, the first and third doped semiconductor regions, 118a and 118b, respectively, are formed simultaneously. The gate well region 120 may be formed over the storage well region 116, between the first and third doped semiconductor regions, 118a and 118b, respectively. In an embodiment, the gate well region 120 may be formed in the semiconductor substrate 110. The gate well region 120 may be a retrograde well with a lower doping concentration at an upper portion of the gate well 120a and a higher doping concentration at a lower portion of the gate well 120b. The upper and lower portions of the gate well region, 120a and 120b, may be collectively referred to as the gate well region 120. The formation of the first and third semiconductor regions, 118a and 118b, respectively, and the gate well region 120 may include doping with boron to form p-doped semiconductors followed by activation annealing. In an embodiment, the first and third doped semiconductor regions, 118a and 118b, respectively, may have the same dopant concentration.

Figure 4:
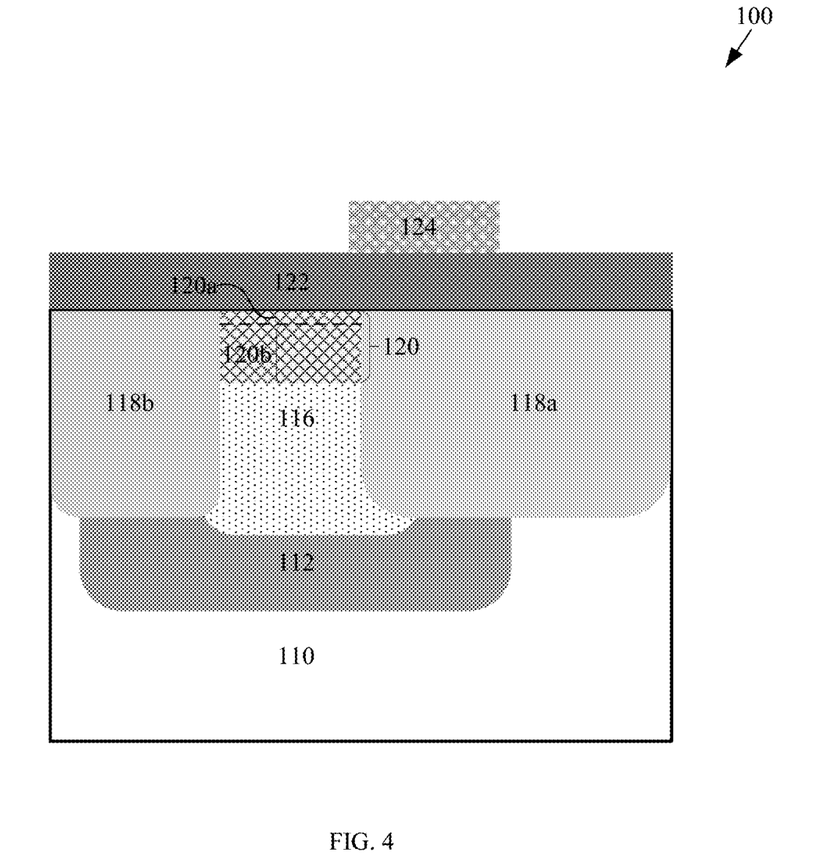
FIG. 4 is a cross-section view of a partially completed CMOS image sensor pixel after formation of a dielectric layer and formation of a photoresist layer to cover a portion of the dielectric layer, according to an embodiment of the disclosure.

FIG. 4 is a cross-section view of a partially completed CMOS image sensor pixel 100 after formation of a dielectric layer 122 and formation of a photoresist layer 124, according to an embodiment of the disclosure. Referring to FIG. 4, the dielectric layer 122 may be made of silicon dioxide. In an embodiment, the dielectric layer 122 may be formed over the semiconductor substrate 110. The formation of the dielectric layer 122 may be by thermal oxidation, chemical vapor deposition (CVD), atomic layer deposition (ALD), physical vapor deposition (PVD) or any other suitable methods. A layer of photoresist 124 may be deposited over the dielectric layer 122 followed by conventional photoresist exposure and developing to form a photoresist pattern, consistent with prior art practices. The developed photoresist layer 124 covers at least a portion of the dielectric layer 122 over the first doped semiconductor region 118a.

Figure 5:
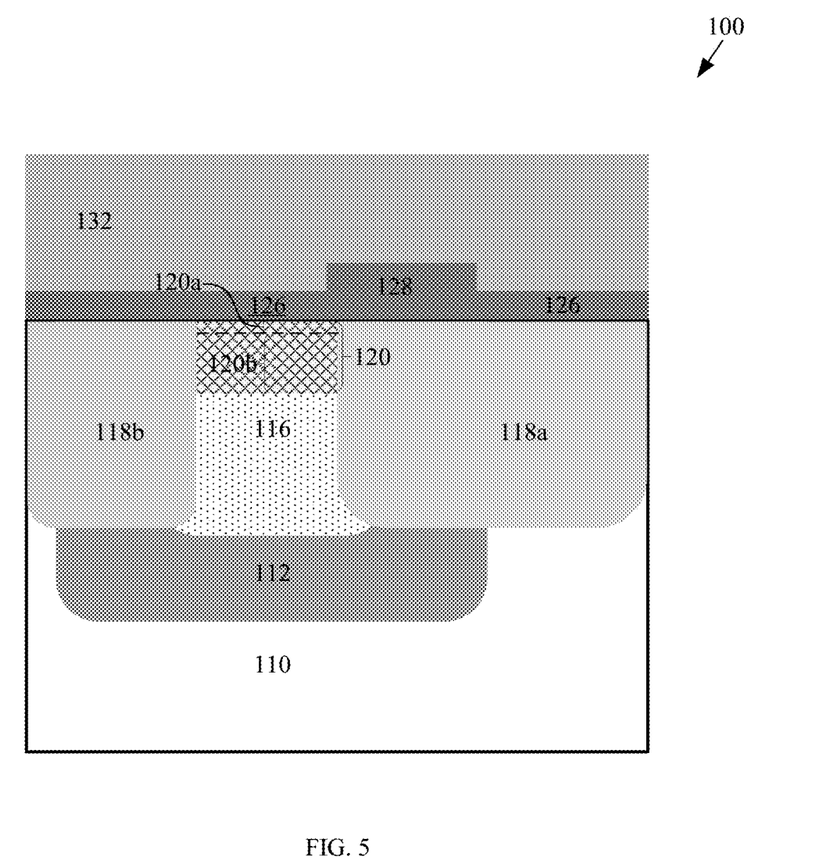
FIG. 5 is a cross-section view of a partially completed CMOS image sensor pixel after forming a first section of the dielectric layer, removing the photoresist layer to expose a second section of the dielectric layer and depositing a gate electrode layer over the dielectric layer, according to an embodiment of the disclosure.

FIG. 5 is a cross-section view of a partially completed CMOS image sensor pixel 100 after forming a first section of the dielectric layer 126, removing the photoresist layer 124 to expose a second section of the dielectric layer 128 over the first doped semiconductor region 118a and depositing a gate electrode layer 132, according to an embodiment of the disclosure. Referring to FIG. 5, the formation of the first section of the dielectric layer 126 may include removing portions of the dielectric layer 122 that are not covered by the photoresist layer 124 followed by formation of the first section of the dielectric layer 126. In an embodiment, the photoresist layer 124 may be removed prior to the formation of the first section of the dielectric layer 126. In an embodiment, the first section of the dielectric layer 126 is formed over the semiconductor substrate 110. The removal of the dielectric layer 122 may be by wet or dry etch process. The formation of the first section of the dielectric layer 126 may be by thermal oxidation, CVD, ALD, PVD or any other suitable methods. In an embodiment, the first section of the dielectric layer 126 may be made of silicon dioxide. In an embodiment, the first section of the dielectric layer 126 may be thinner than the second section of the dielectric layer 128. In an embodiment, the gate electrode layer 132 may be made of a conductive layer of polysilicon or amorphous silicon. The gate electrode layer 132 may be deposited by CVD, ALD, PVD or any other suitable deposition methods. In an embodiment, the gate electrode layer 132 may be doped with phosphorus or arsenic to a level on the order of $10^{17}$ to $10^{20}$ cm$^{-3}$. This may be done either by in-situ doping during the deposition of the gate electrode layer 132 or by ion implantation into the gate electrode layer 132 or any other suitable methods.

Figure 6:
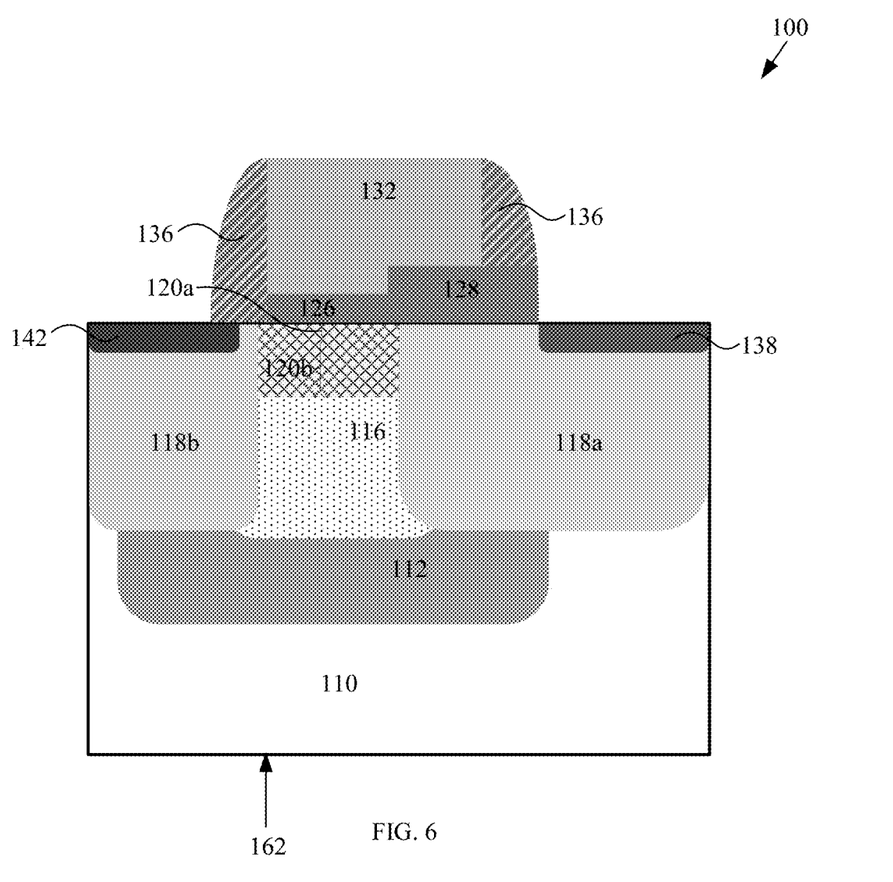
FIG. 6 is a cross-section view of a CMOS image sensor pixel after patterning the gate electrode layer, forming spacer structures on side surfaces of the gate electrode layer, formation of a second doped semiconductor region and a contact for the third doped semiconductor region, according to an embodiment of the disclosure.

FIG. 6 is a cross-section view of a CMOS image sensor pixel 100 after patterning the gate electrode layer 132, removing portions of the first section of the dielectric layer 126 using the gate electrode layer 132 as a masking layer, forming spacer structures 136 on side surfaces of the gate electrode layer 132, formation of a second doped semiconductor region 138 and a substrate contact 142, according to an embodiment of the disclosure. Although not shown, the patterning of the gate electrode layer 132 may include deposition and patterning of a layer of photoresist material on the gate electrode layer 132 followed by removal of portions of the gate electrode layer 132 that are not covered by the photoresist pattern, consistent with prior art practices. The patterned gate electrode layer 132 covers at least a portion of the first section of the dielectric layer 126 and a portion of the second section of the dielectric layer 128. Uncovered portions of the first section of the dielectric layer 126 may be removed from part of the first and third doped semiconductor regions, 118a and 118b, respectively, after patterning of the gate electrode layer 132. The removal of the first section of the dielectric layer 126 may be by a wet or dry etch process or any other suitable methods.

Dielectric spacers 136 are formed on side surfaces of the gate electrode layer 132 and the first section of the dielectric layer 126. The formation of dielectric spacers 136 may include depositing a layer of silicon dioxide over the gate electrode layer 132 and the first section of the dielectric layer 126 and on the second section of the dielectric layer 128. The silicon dioxide layer may be anisotropically etched to form dielectric spacers 136. The silicon dioxide layer may be removed from a side surface of the second section of the dielectric layer 128 during the anisotropic etching process. The silicon dioxide layer may be deposited by CVD, ALD, PVD or any other suitable deposition methods. The term "anisotropic etching" refers to etching which does not proceed in all directions at the same rate.

A second doped semiconductor region 138 is formed adjacent to the gate. The formation of a second doped semiconductor region 138 may include doping with phosphorus or arsenic to form an n-doped semiconductor followed by activation annealing. The formation of a substrate contact 142 may include doping with boron to form a p-doped semiconductor followed by activation annealing. In an embodiment, the substrate contact 142 may have a higher dopant concentration than the third doped semiconductor region 118b. In an embodiment, the substrate contact 142 may be formed in the semiconductor substrate 110.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:

1. An image sensor pixel comprising:
a semiconductor substrate;
a gate having a dielectric layer with a first section and a second section over the semiconductor substrate, wherein the first section of the dielectric layer is thinner than the second section;
a photodiode is disposed substantially beneath the gate;
a gate well region is disposed beneath the gate and overlying the photodiode, wherein a first doped semiconductor region separates the gate well region from a second doped semiconductor region; and
the second doped semiconductor region is in the semiconductor substrate, wherein the second doped semiconductor region is adjacent to the gate.

2. The image sensor according to claim 1, wherein the second section of the dielectric layer is adjacent to the second doped semiconductor region.

3. The image sensor according to claim 1, wherein the gate further comprises a gate electrode layer covering the first section of the dielectric layer and a portion of the second section of the dielectric layer;
wherein the first section of the dielectric layer is over the gate well region; and
wherein the portion of the second section of the dielectric layer covered by the gate electrode layer is adjacent to the gate well region.

4. The image sensor according to claim 3 further comprising:
dielectric spacers on side surfaces of the gate.

5. The image sensor according to claim 1, wherein the photodiode further comprises a storage well region; and
a deep well region is disposed beneath the storage well region.

6. The image sensor according to claim 5, wherein the storage well region has a higher dopant concentration than the deep well region.

7. The image sensor according to claim 5, wherein the second doped semiconductor region has a higher dopant concentration than the storage well region.

8. The image sensor according to claim 5, wherein the second doped semiconductor region, storage well and deep well regions are made of n-doped semiconductors.

9. The image sensor according to claim 1, wherein the gate well region has a higher dopant concentration than the first doped semiconductor region.

10. The image sensor according to claim 1 further comprising:
a third doped semiconductor region, the third doped semiconductor region having an upper portion and a lower portion;

wherein the upper portion of the third doped semiconductor region is in the semi conductor substrate;

wherein the upper portion of the third doped semiconductor region has a higher dopant concentration than the lower portion of the third doped semiconductor region; and wherein the third doped semiconductor region is positioned on an opposite side of the gate well from the first doped semiconductor region.

11. The image sensor according to claim 10, wherein the substrate, gate well, first doped semiconductor and third doped semiconductor regions are made of p-doped semiconductors.

12. An image sensor pixel comprising:

a semiconductor substrate;

a gate having a dielectric layer with a first section and a second section over the semiconductor substrate, wherein the first section of the dielectric layer is thinner than the second section;

a photodiode is disposed substantially beneath the gate;

a gate well region is disposed beneath the gate and overlying the photodiode, wherein a first doped semiconductor region separates the gate well region from a second doped semiconductor region;

the second doped semiconductor region is in the semiconductor substrate, wherein the second doped semiconductor region is adjacent to the gate;

wherein the gate well region is disposed beneath the first section of the dielectric layer; and wherein the first doped semiconductor region is disposed beneath the second section of the dielectric layer.

* * * * *